United States Patent [19]

Stapelmann et al.

[11] Patent Number: 5,106,592
[45] Date of Patent: Apr. 21, 1992

[54] MANIPULATING LIQUIDS FOR GROWING CRYSTALS IN OUTER SPACE

[75] Inventors: Juergen Stapelmann, Fridrichshafen; Robert Bosch, Oberteueringen; Lothar Potthast, Immenstaad, all of Fed. Rep. of Germany

[73] Assignee: Dornier GmbH, Friedrichshafen, Fed. Rep. of Germany

[21] Appl. No.: 627,649

[22] Filed: Dec. 13, 1990

[30] Foreign Application Priority Data

Dec. 13, 1989 [DE] Fed. Rep. of Germany ....... 3941098

[51] Int. Cl.⁵ .......................................... B01D 9/00
[52] U.S. Cl. .................................. 422/245; 156/600; 156/DIG. 62; 156/DIG. 93; 422/100
[58] Field of Search ....... 156/600, DIG. 62, DIG. 93; 422/100, 245

[56] References Cited

U.S. PATENT DOCUMENTS 4,665,034  5/1987  Chandler .......................... 422/100
4,786,471 11/1988  Jones et al. ....................... 422/100

Primary Examiner—Robert Kunemund
Assistant Examiner—Felisa Garrett
Attorney, Agent, or Firm—R. H. Siegemund

[57] ABSTRACT

The invention relates to the careful manipulation of liquids in outer space for purposes of growing crystals, particularly protein crystals. The invention is realized in the hanging drop method; the interface diffusion method and the dialysis method.

25 Claims, 3 Drawing Sheets

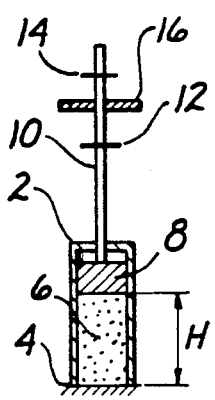
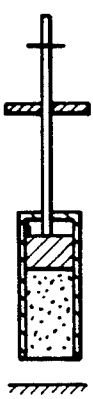
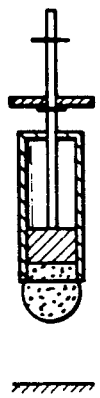
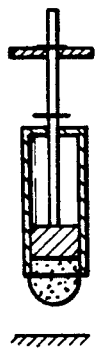
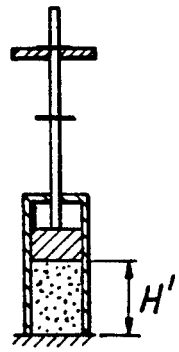
Fig.1.1   Fig.1.2   Fig.1.3   Fig.1.4   Fig.1.5
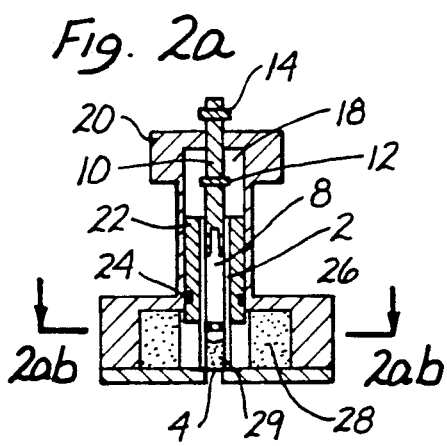
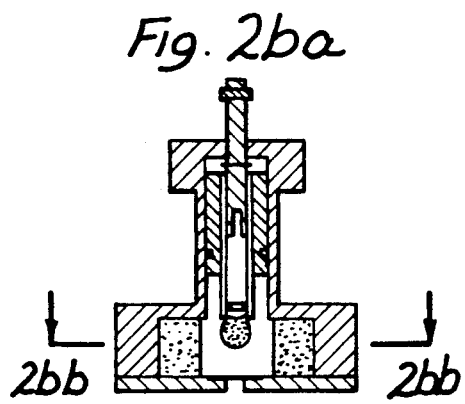
Fig. 2a   Fig. 2ba
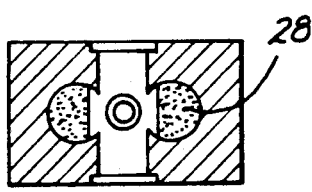
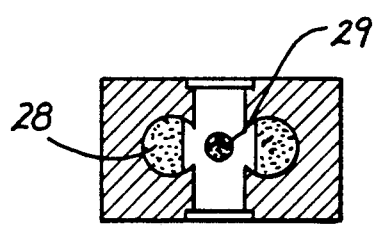
Fig. 2ab   Fig. 2bb

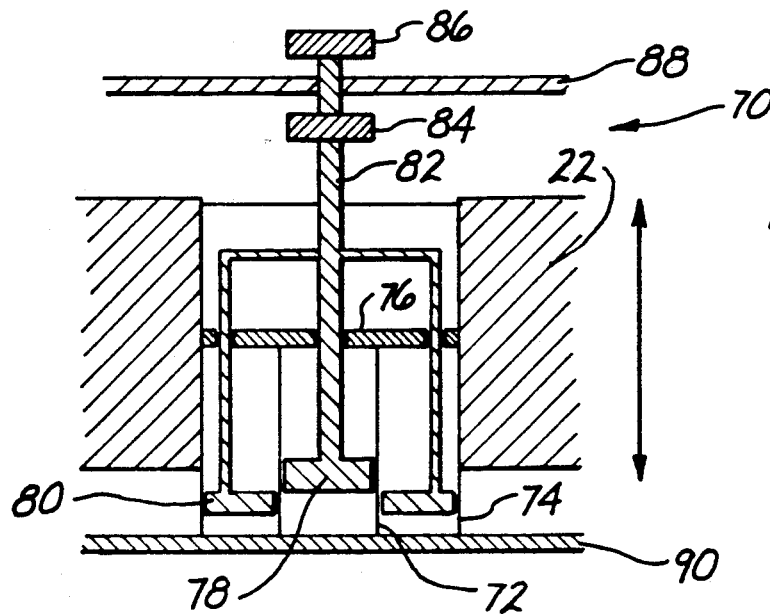
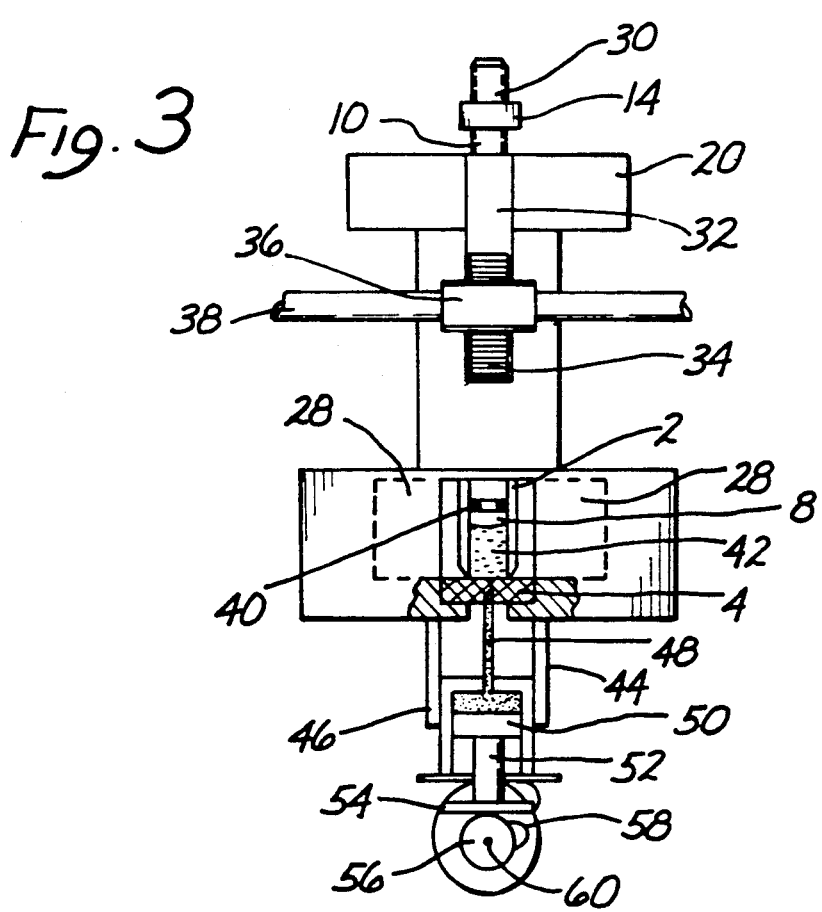

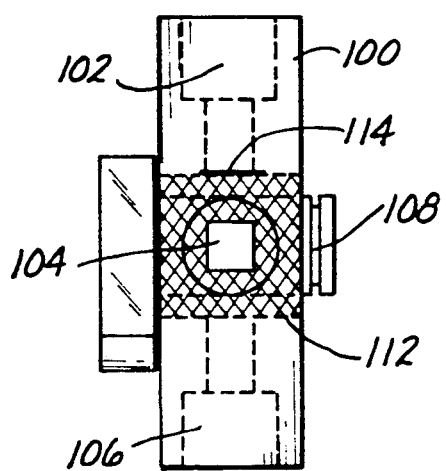
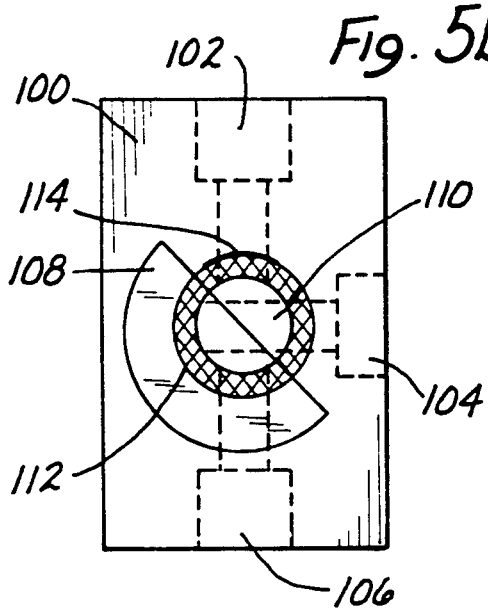
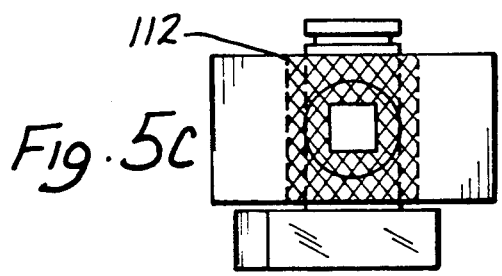
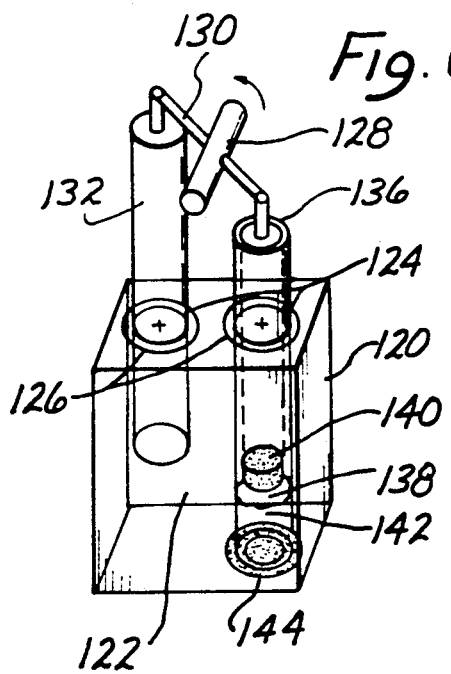
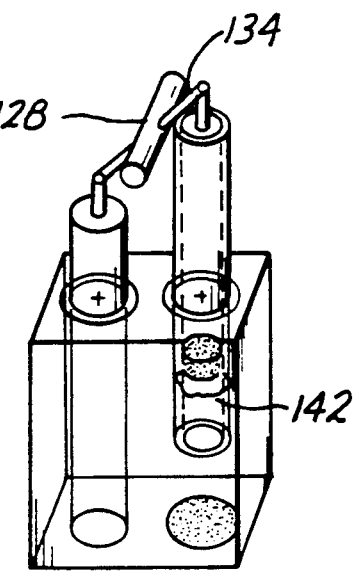

MANIPULATING LIQUIDS FOR GROWING CRYSTALS IN OUTER SPACE

BACKGROUND OF THE INVENTION

The present invention relates to an apparatus and equipment for manipulating liquids particularly for the growth of crystals under zero or near zero gravity conditions such as in outer space.

The growth of crystals in outer space has been practiced and is further considered on a program basis as shown for example in U.S. Pat. No. 4,886,646 or in the Journal of Crystal Growth, volume 76, 92 respectively on pages 681 et seq and 581 et seq. Generally it has been found to be of advantage to use for example a protein solution for the crystal growth and to keep separate therefrom the precipitating medium prior to and during the transport of these media into outer space to keep them separate until crystallization is desired for obtaining crystal growth these two media are blended. In the so called hanging drop method a drop or droplet is suspended from one side and is comprised of unsaturated solution with an initial volume of V1. Through appropriate steps the liquid is gradually evaporated; of course not completely but such that its volume is reduced to V2 thus there will be a desired supersaturation that leads to the crystallization of that substance. Further to the state of the art, the above mentioned patent also alludes to other crystal growth methods such as diffusive method using a dialysis bag.

This hanging drop method of course has been practiced on Earth under gravity conditions but it is apparent that on practicing this method in outer space under zero gravity or at least under reduced gravity conditions the drops that can be produced and be suspended (before dropping) can be much larger and that in turn means that larger crystals can be grown in this environment. Earth bound crystal growth e.g. of the hanging drop method or otherwise an outer space equipment must meet the following requirement and/or has to have the following features.

Whatever media are involved they will be tightly sealed prior to the beginning of the crystal growth and manipulation. The droplet itself should be produced on demand but automatically i.e. without manual manipulation. Most importantly after the process has been completed the liquid has to be returned to a tightly vacuum sealed condition under avoidance of gas bubbles or other voids i.e. a residual droplet must be retracted into some kind of container and fill it completely since otherwise the crystal grown therein, if of a delicate nature, may not survive the landing.

DESCRIPTION OF THE INVENTION

It is an object of the present invention to provide a new and improved equipment for crystal growth on or near zero gravity conditions as they prevail in outer space and more particularly the invention relates to equipment for manipulating the components participating in the crystal growth under the conditions outlined above with particular goal in mind that prior to experiment generally various constituents have to be kept separate in tightly sealed containers and following the experiment everything has to be stored away safely and in a sealed fashion without endangering it.

In accordance with one preferred embodiment of the present invention the equipment for handling liquid in which crystals are to be grown under zero gravity conditions and include a frame with a recess for receiving a device that is movable in relation to the frame and holds the container for one of the liquids, the container being maintained in a sealed condition by being forced against a seal. Prior to crystallization the container is to be separated from the seal by moving the device in the above mentioned recess. By means of a plunger that moves in this container in between different positions definite volumina can be maintained therein. In addition this particular container is surrounded by some means that contains a second liquid likewise sealed as long as the container is sealed, but the liquids can mix whenever brought together in some form.

Aside from the hanging drop method, two other methods are suggested, for crystallizing protein; the free interface diffusion method and the dialysis method. Both have in common that supersaturation obtains through diffusion of the participation medium or agent into the protein solution. The free interface diffusion method uses a separating layer between protein solution and precipitation agent through which diffusion obtains in both directions to equalize concentration. It is proposed to use here rotating portion for causing the different liquids to come in contact. The dialysis method uses a membrane for unidirectional diffusion, and pistons operate in phase opposition to control the contact of liquid.

DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 1 illustrates in five portions 1.1., 1.2, 1.3, 1.4, 1.5 by way of example a process carried out in accordance with the hanging drop method generally and including equipment of certain particularity;

FIG. 2 is a device in greater detail to be used for practicing the method as shown in FIG. 1 and includes;

FIG. 2a as a section view through the equipment for carrying out the method in accordance with FIG. 1;

FIG. 2ab is a section along line A—A in FIG. 2a;

FIG. 2ba is a section similar to FIG. 2aa but showing a different phase in the operation of the equipment;

FIG. 2bb is a section along the line B—B in FIG. 2ba;

FIG. 3 is a view of somewhat schematic nature showing equipment for practicing the hanging drop method;

FIG. 4 is a section view of still further equipment for producing the hanging drop method;

FIG. 5a, 5b, 5c are respectively side view, bottom view and section view of equipment for carrying out a so called free interface diffusion method; and FIGS. 6a and 6b are isometric views which show two different phases in the operation of equipment for carrying out the so called dialysis method.

Proceeding now to the detailed description of the drawings, FIG. 1 illustrates basically a hanging drop method under a simplified showing of the equipment for the production and retraction of the drop at the end of tube for practicing the hanging drop method. FIG. 1.1 as well as the others illustrates a small tube 2 made of glass and which has a completely open lower end and a partial closure at the upper end with a passage for a rod 10. The lower end in FIG. 1.1 of the tube is closed by a stationary sealing element 4. This seal may for example be comprised of silicon rubber or polytetrafluoroethylene, PTFE. The material of seal 4 should not only provide for a good elastic sealing but should wet the liquid in the tube 2 only as little as possible.

The liquid 6 that occupies the tube 2 in the beginning of the process occupies therein a volume V1 which is established by a plunger 8 movably disposed in the tube 2 and being affixed to the inner end of the rod 10. The particular volume V1 is presumed to be present when the plunger 8 has a distance H from the open but now closed end of the tube 2.

The rod 10 as two stops 12, 14 arranged on both sides of a stationary abutment plate or disk 16. This plate 16 limits the movement of the rod 10 and of the plunger 8 vis-a-vis the stationary equipment given by 4 and 16 while the amount of displacement of the plunger 8 depends in addition on the relative position of the tube 2 vis-a-vis the disk 16.

Now FIG. 1.1 shows, as stated, the plunger 8 to be retracted to establish in tube 2 a volume V1 (height H) for the liquid 6 and the tube 2 is sealed while the plate 16 is situated in about the middle between the two stops 12, 14. In the beginning tube 2 together with plunger 8 and the rod 10 is lifted in its entirety until stop 12 abuts disk 16 from below. This is shown in FIG. 1.2. Further movement of the tube 2 in the up direction causes the plunger 8 to push the liquid out of the now open end of the tube 2. This will continue until the stop 12 abuts the disk 16 from below, a situation that is shown in FIG. 1.3.

Now the experiment begins and the equipment stays in the illustrated position of FIG. 1.3 while liquid evaporates. After a while the liquid of the drop has been diminished and the crystal has begun to grow in the drop when it is time to retract the liquid with the crystal therein into the tube; the tube 2 together with the plunger 8 is lowered until the upper stop 14 abuts the disk abutment plate (FIG. 1.4) from below. From then on the plunger will be held in position while the tube 2 continues downward until abutting the seal 4. As a consequence the liquid is sucked back into the tube 2.

The various parts meaning the spacing of the disks 12, 14 from each other and the distance of the abutment plate 16 from the seal 4 in conjunction with the various dimensions including the dimensions of the tube make sure that the sealing condition as shown in FIG. 1.5 obtains in exactly that instant when all liquid has been sucked into the tube 2, and has not evaporated without creation of any void. The equipment therefore sucks the residual equipment with the column V2 back into the tube 2 without stopping any excess and without formation of any bubbles.

Proceeding to the description of FIG. 2 i.e. 2aa, 2ab, 2ba and 2bb they show a device for increasing the concentration of a precipitating medium within a protein solution by evaporation of the solvent so as to obtain crystallization. The precipitation medium may be generally a solution with a relatively low vapor pressure as far as the protein solution is concerned. For this endeavor a frame 20 is provided with a cut out 18 receiving a holding device 22 the latter being sealed vis-a-vis the frame by at least one sealing ring 24.

A tube 2 made for example of optical glass or acrylic glass or the like is held in the device 22. This tube 2 is secured to the device 22 and is thus made movable within the cutout 18 of the frame 20. The plunger 8 as stated is movably disposed in the tube 2, and the plunger is also shown to be connected to the rod 10. The plunger 8 is sealed against the inner wall of tube 2 by means of a sealing ring 26. The end of the tube 2 projects from the device 22 and is normally sealed by means of sealed portion 4. The sealing condition is maintained during the entire transport of the equipment to wherever location the device is to be moved and the experiment to be carried out e.g. in outer space.

The drum 20 is widened around the tube 2 which is filled with a soakable material 28 e.g. a sponge which has soaked up the precipitating medium. During the transport phase the protein solution 29 is held inside tube 2 between the plunger 8 and seal 4. This is then analogous to the specific situation for the liquid 6 of FIG. 1.1. Again it is assumed that the initial value V' is occupied by this protein liquid. The rod 10 is provided with two stops 12, 14 which is analogous to the situation as was explained with reference to FIG. 1 but now the simple plate disk 16 of FIG. 1 is here now realized by the construction of the frame 20 itself.

As stated FIG. 2aa shows a condition of the equipment during the transport phase that means before the experiment and the state there corresponds to FIG. 1.1. FIG. 2ba is the state equivalent of FIG. 1.3 i.e. it shows the position of tube and plunger so that it forms a drop and the experiment obtains. In this case then the drop is exposed to whatever evaporates from the sponge 28.

FIG. 3 illustrates a modification of the equipment shown in the FIGS. 2aa etc and is applicable to the principal description of arrangement as per FIG. 1. The parts 2,8,4,10,12 and 14 are the same at least in function as they have been explained thus far. Now in this case the rod 10 is provided with an outer threading 30 at one end upon which a nut 14' is threaded serving in this particular case as the upper stop member. The selection of threading determines the relative position of the nut end of the stop 14 on the rod 10. The inner stop is not shown in this case. It is analogously provided as a threaded on nut.

The rod 10 extends into the tube 2 being provided in the inside of the device 32 and being secured thereto. This device 32 is a rack and establishes motion of the tube 2. The rack 32 has a toothed area or zone or range 34 meshing a gear 36 which in turn sits on and is rotated by a shaft 38. The shaft 38 is suitably turned by any suitable motor in principle it could be a crank but we are talking about outer space equipment there would be a connection to a motor.

The rod 10 is connected with plunger 8 having a sealing ring 40. The tube here is normally forced against a seal 4 and prior to any experiment in crystallization the volume V1 is established as the distance between the plunger 8 and the seal 4 and that space is occupied by protein solution 42 e.g. during takeoff and before and prior to the conduction of the experiment in outer space. Also here the condition will be similar after which except that the plunger 8 is somewhat closer to the end of tube 2 as the volume of protein solution remaining is only V2.

On the side facing the seal 4 is a guide 44 for another piston 46. This piston is provided with a hollow needle 48 at its bottom. Within the piston 48 is a plunger 50 being connected to a rod 52 and a plate or disk 54. The plate or disk 54 is in contact with a first cam wheel 56 which is mounted on a shaft 60 and rotates therewith. The shaft 60 carries also second cam disk 58. The shaft 60 is rotated by a motor which is not shown. The second disk 58 moves the piston 46. Cam disks 56 and 58 have a phase shift in relation to each other so that piston 46 and plunger 50 are acted upon at a certain delay.

As the shaft 60 rotates the piston 46 first moves towards the seal 4 whereupon the needle 48 perforates the seal 4. As the rotation of the shaft 6 continues plunger 50 will be moved inside piston 46 so that the precipitating medium 62 that is inside the piston 46 is forced through the hollow needle 48 into the protein solution 42. This is a preparatory step in order to bring two media together at a point in time when it is appropriate.

The timing of the operation of plunger 8 on one hand, and plunger 50 and piston 46 on the other hand is selectable. The needle 48 may inject the content 62 into the liquid 42 prior to the formation of a drop, or the drop may form first while the liquid 62 is then injected into the space that surrounds the drop. The subsequent procedure is exactly as shown in FIG. 1, the needle 48 will be retracted from the seal 4 by further rotation of shaft 60 and may be supported here by other parts. The further movement of the tube 2 is then carried out by operation of the rack and pinion drive 32-36 to follow the procedure outlined with reference to FIG. 1.

A further modification of operation is shown in FIG. 4. This figure show a plunger rod 82 carrying stop disks 84 and 86 and a piston plunger 78 moving inside a tube 72. These parts respectively correspond to 10,12,14,8,2 in the preceding figures. More specifically shown here are two telescope tubes 72,74 which are interconnected by means of a position fixing or holding device 76 being further converted to the drive 22'. Two plungers 78 and 80 are respectively situated within the tubes 72 and 74 and they are both connected to the same rod 82. Reference numeral 88 refers to a stationary plate equivalent to abutment plate 16 in FIG. 1. During transporting the device, the two tubes 72,74 are both forced against a seal plate 90 which is the equivalent of seal 4 in the preceding figures. The contents of the tubes 72,74 are thus securely separated from each other.

The two tubes 72,74 will be held in a sealing condition on one hand and opened on the other hand with a single mechanism. A certain droplet will be produced below tube 72 and subsequently on evaporation sucked back into the tube whereby again the entire liquid that did not evaporate is sucked back into the tube 22. The central drive 22 will move holder 76 up and down for movement of the two plungers 78 and 80. The position and motion of the various components follow basically the same concept outlined with reference to FIG. 1.

FIGS. 5a-c show an experimentation cell for the protein crystallization in accordance with the free interface diffusion method. A cell body of basic container or housing will support body 100 is made of quartz and in its interior there are three spaces 102,104,106. A rotatable piston 108 is provided where these spaces communicate and the rotating piston controls intercommunication. In particular the piston is provided with the passage 110. A hose C112 is arranged around the rotating piston 108 which seals in effect the volumina 102,104,108 in relation to each other as well as towards the outside. The hose 112 is preferably made of Si rubber. Chamber, cavity or space 102 contains the protein solution while the space, chamber or cavity 106 contains the precipitation agent.

The passage 110 on the other hand contains a liquid which permits a diffusion between the precipitation agent in chamber 106 and the protein solution in chamber 102, whenever the rotating piston has a disposition that permits this diffusion passage of liquid from chamber 106 to 102 and vice versa. The chamber 104 serves as reservoir for replenishing the content of liquid in bore 110. The membrane 114 is not present when this interface diffusion method is practiced.

If this particular arrangement is to be used for the dialysis method then a dialysis membrane 114 can be placed between the seal 112 and the basic support body 100. In this case then both chamber 106 as well as passage 1110 may contain the precipitation agent.

Another experimental device for protein crystallization is shown in FIG. 6 wherein also in particular the dialysis method is to be practiced. Two openings 126 are provided in a chamber or container 120 which is filled with a precipitation medium 122. The openings 126 are equipped with ring seals 124. A shaft 128 is provided outside the chamber or container 120 and carries a first arm 130 being in turn connected movably with a glass rod 132. This glass rod 132 penetrates an opening 126 of the chamber 120 and acts as a displacement device. A second arm 134 is also mounted to the shaft 128 and is disposed opposite the first arm 130, Arm 134 is connected to a glass tube 136. Tube 136 in turn penetrates the second opening 126 of the container 120.

Glass rod 132 and glass tube 136 are connected to the shaft 128 in such a manner that upon turning of the shaft 128 either the glass rod or the glass tube 136 dip deeper into the container 120, in an anticyclic fashion. Tube 136 contains the protein solution 138. The lower portion is sealed vis-a-vis the remaining volume of the glass tube 136 by means of the septum or sealing disk 140. The low space of glass tube 136 between seal 140 and the lower end of the tube is partitioned by a dialysis membrane 142.

During the transport phase, that is during starting and landing of the outer space mission, tube 136 in container 120 is forced against a sealing disk 144 in the bottom of container 120. That disk is preferably made of Si rubber. This way tubes 136 is closed off vis-a-vis the surrounding precipitating medium 122. For purposes of activation tube 36 will be moved in up direction, this motion obtains by turning of the shaft 128. Concurrently particularly for purposes of volume compensation glass rod 132 is shifted into the container 120. This way, tube 136 is lifted off seal 144, opening up space between the dialysis membrane 142 and the lower end of tube 136. Now whatever diffusion and reaction is needed takes place in the lower part of tube 136.

The invention is not limited to the embodiments described above but all changes and modifications thereof, not constituting departures from the spirit and scope of the invention, are intended to be included.

We claim:

1. Apparatus for the manipulation of liquids particularly under zero gravity or near zero gravity conditions in space vehicles, comprising:

frame means with an opening for establishing a moving and receiving space;

a holder moveably disposed in said frame means;

a first container for a first liquid and being open at one end, mounted in said holder and moving therewith;

a second container surrounding at least the open end of the first container and provided for holding a second liquid to be brought in physical contact with the first liquid;

sealing means against which the open end of said first container can abut in sealing fashion and from which it can be receded for the first liquid when in the first container to emerge as a drop from the open end of the first container;

a plunger with rod, the plunger being moveably disposed in said first container, there being means in an end opposite said open end of the first container through which the rod traverses;

stop means on the rod in spaced apart relationship and cooperating with abutment means for limiting a displacement stroke of the plunger in said container;

means for separately and individually moving said holder for moving said first container to and from said sealing means whereby in cooperation with the abutment and the stop means the plunger will move in the container or being held therein for causing formation of a drop so that liquid can evaporate from the drop the remaining liquid being subsequently fully sucked into the first container when the open end of the first container reengages the sealing means by operation of the moving means; and said second container being positioned such that the second liquid being exposed to the first liquid when the first container is lifted off the sealing means by operation of the holder moving means.

2. Device as in claim 1, said moving means being driven through cam disk means.

3. Device as in claim 1, including rack and pinion drive for said holding means.

4. Device as in claim 1, the second container surrounding at least the open end of the first container.

5. Apparatus as in claim 4 said second liquid being contained in a sponge means in the second container.

6. Apparatus as in claim 4, there being a further plunger means connected to said rod for action on the second liquid in said second container, said second container being also open and sealed when in engagement with said sealing means in coincidence with sealing of the first container means against said sealing means.

7. Device as in claim 1, including a additional sealing means for sealing said holding means in relation to said frame.

8. Device as in claim 1, and said plunger including at least one sealing ring for sealing against a wall of the first container.

9. Device as in claim 1, said stop means being adjustably mounted on said rod.

10. Device as in claim 1, said sealing means being made of silicon rubber.

11. Device as in claim 1, said sealing means being made of polytetrafluoroethylene.

12. Device as in claim 1, said container being of tubular configuration.

13. Apparatus for manipulating liquids under zero gravity or near zero gravity in space vehicles comprising:

a container means with at least two separate chambers;

two different liquids in said chambers;

a rotating piston contained also in said body having a passage way for interconnecting or disconnecting the two chambers depending on the rotational position of the piston;

a further liquid in said passage way;

hose sealing means surrounding the piston for sealing the same as to all chambers and the passage way; and means for rotating the piston; and said liquids being such that two directional diffusion obtains through the liquid in the passage way as between the liquids in the two chambers.

14. Apparatus as in claim 13, including a dialysis membrane disposed between the hose and one of the chambers, the liquids in the passage and in the other chamber being the same.

15. Apparatus as in claim 13, said cell containing body being made of quartz.

16. Apparatus as in claim 13, said hose being made of silicon rubber.

17. Apparatus for manipulating liquids under zero gravity or near zero gravity in space vehicles comprising:

a front container filled with a first liquid the container having at least two openings;

a shaft with drive having a first and a second arm;

a displacement means on the first arm and reaching into the opening of the first container;

a second container on said arm and reaching into the second opening of the first container;

a second liquid in the second container which is sealed relation to a residual volume of the second container to be sealed vis-a-vis said first container by operation of forcing an open end against the second container against a sealing means; and upon pivoting the arm, the second container is lifted off the sealing means, while liquid is displaced into the second container through deeper immersion of the displacement means.

18. Apparatus as in claim 17, said openings being sealed.

19. Apparatus as in claim 18, the second container being provided with a dialysis membrane, separating the second liquid from the residual space.

20. Apparatus as in claim 17, said displacement means and said second container being of cylindrical configuration.

21. Apparatus as in claim 17, said second container and said displacement means being made of glass.

22. Apparatus as in claim 17, the sealing means being made of silicon rubber.

23. Apparatus for the manipulation of liquids particularly under zero gravity or near zero gravity conditions in space vehicles, comprising:

frame means with an opening for establishing a moving and receiving space;

a holder moveably disposed in said frame means;

a first container for a first liquid and being open at one end, mounted in said holder and moving therewith;

sealing means against which the open end of said first container can abut in sealing fashion and from which it can be receded for liquid when in the first container to emerge as a drop from the open end;

a second container underneath the sealing means and in alignment with the open end of the first container and having a second liquid to be brought in physical contact with the first liquid;

there being a hollow needle on the second container and in communication with the interior of the second container such that the second liquid may discharge through the needle;

a plunger in the second container to move the second liquid into and out of the needle:

first moving means for moving the second chamber with the needle so that the needle can perforate the sealing means;

second moving means for the plunger to move the second liquid out of the second chamber after the needle has perforated the sealing means, so that the second liquid can contact the first liquid in the first container;

a second plunger with rod, the second plunger being moveably disposed in said first container, there being means in an end opposite said open end of the first container through which the rod traverses;

third moving means for moving said holder, thereby moving said first container to and from said sealing means whereby in cooperation with the abutment and the stop means the second plunger will move in the first container or being held therein for controlled emergence of the first liquid as a droplet from the first container and for controlled retraction into the first container at a later time.

24. Apparatus as in claim 23, said first and second moving means including cam means for timed operation.

25. Apparatus as in claim 4, the second container containing a piston for moving the second liquid out of the second container when the first container lifts off the sealing means.

* * * * *